United States Patent [19]

Tanaka et al.

[11] Patent Number: 5,053,354

[45] Date of Patent: Oct. 1, 1991

[54] METHOD OF FABRICATING A REVERSE STAGGERED TYPE SILICON THIN FILM TRANSISTOR

[75] Inventors: Sakae Tanaka; Yoshiaki Watanabe, both of Tokyo; Katsuo Shirai; Yoshihisa Ogiwara, both of Tochigi, all of Japan

[73] Assignees: Seikosha Co., Ltd.; Nippon Precision Circuits Ltd., both of Tokyo, Japan

[21] Appl. No.: 535,440

[22] Filed: Jun. 8, 1990

Related U.S. Application Data

[62] Division of Ser. No. 358,035, May 26, 1989, Pat. No. 4,979,006.

[30] Foreign Application Priority Data

May 30, 1988 [JP] Japan .................. 63-132093

[51] Int. Cl.⁵ .............. H01L 21/20; H01L 21/205
[52] U.S. Cl. ............................ 437/101; 437/40; 437/41
[58] Field of Search .......... 437/40, 41, 101; 357/2, 357/4, 23.7

[56] References Cited

FOREIGN PATENT DOCUMENTS

| 0253201 | 1/1988 | European Pat. Off. | 437/101 |
| 0105275 | 6/1985 | Japan | 357/23.7 |
| 0141776 | 6/1987 | Japan | 357/2 |
| 0102263 | 5/1988 | Japan | 357/23.7 |
| 0104479 | 5/1988 | Japan | 437/101 |

Primary Examiner—Olik Chaudhuri
Assistant Examiner—M. Wilczewski
Attorney, Agent, or Firm—Jordan and Hamburg

[57] ABSTRACT

A reverse staggered type silicon thin film transistor includes a substrate having a gate electrode; a gate insulating layer on the substrate and the gate electrode, the gate insulating layer having a transistor-forming portion; a lower layer silicon film on the transistor-forming portion of the gate insulating layer and in contact therewith, the lower layer silicon film being formed at a first temperature and with a first thickness; an upper layer silicon film formed on the transistor-forming portion of the gate insulating layer at a second temperature which is lower than the first temperature and with a second thickness greater than the first thickness; an n-type silicon layer on the upper layer silicon film and in contact therewith; a source electrode on the n-type silicon layer; and a drain electrode on the n-type silicon layer.

1 Claim, 3 Drawing Sheets

METHOD OF FABRICATING A REVERSE STAGGERED TYPE SILICON THIN FILM TRANSISTOR

This is a division of application Ser. No. 358,035, filed May 26, 1989, now U.S. Pat. No. 4,979,006.

BACKGROUND OF THE INVENTION:

The present invention relates to a reverse staggered type silicon thin film transistor.

Research and development of a silicon thin film transistor as an active matrix type liquid crystal display device and a photosensor has been widely carried out.

FIG. 4 shows the above-described silicon thin film transistor, which includes an insulating substrate 1, a gate electrode 2 thereon, a gate insulating layer 3 thereon, a silicon film 4 thereon an n-type silicon film 5 thereon and containing a suitable amount of n-type impurities, and a source electrode 6 and a drain electrode 7 thereon.

The transistor is formed such that gate electrode 2, and source electrode 6 and drain electrode 7, have gate insulating layer 3 and silicon film 4 between them. Moreover, gate electrode 2 is formed at a side or portion of insulating substrate 1, in relation to source electrode 6 and drain electrode 7, which side is denoted as a reverse staggered type silicon thin film transistor.

FIGS. 5 and 6 show two different static characteristics which vary as to the time of light illumination of the reverse staggered type silicon thin film transistor having the above-described structure. In the abscissa is shown a gate voltage Vg, and in the ordinate, a drain current Id, and the drain voltage Vd is 7.5 (V). In both instances, the silicon films 4 are made of amorphous silicon formed by the plasma CVD method, and the film forming temperatures T of the silicon films 4 are 250° C. (FIG. 5) and 350° C. (FIG. 6). The film thickness in either case is 150 (nm).

As is evident from a review of both figures, in the case where the silicon film was formed at 350° C. (FIG. 6), both the on-current and off-current are higher. In a usual thin film transistor, it is preferable that the ratio of the on-current and off-current is as large as possible. However, in the case of the transistor shown in FIG. 5, the on-current is small, and in the case of the transistor shown in FIG. 6, the off-current is large, so that the characteristics of either transistor are not satisfactory.

SUMMARY OF THE INVENTION:

The present invention takes into account the above-described problems and has the object of providing a reverse staggered type silicon thin film transistor in which the on-current is large, but the off-current is small.

DESCRIPTION OF THE PREFERRED EMBODIMENTS

Figure 1:
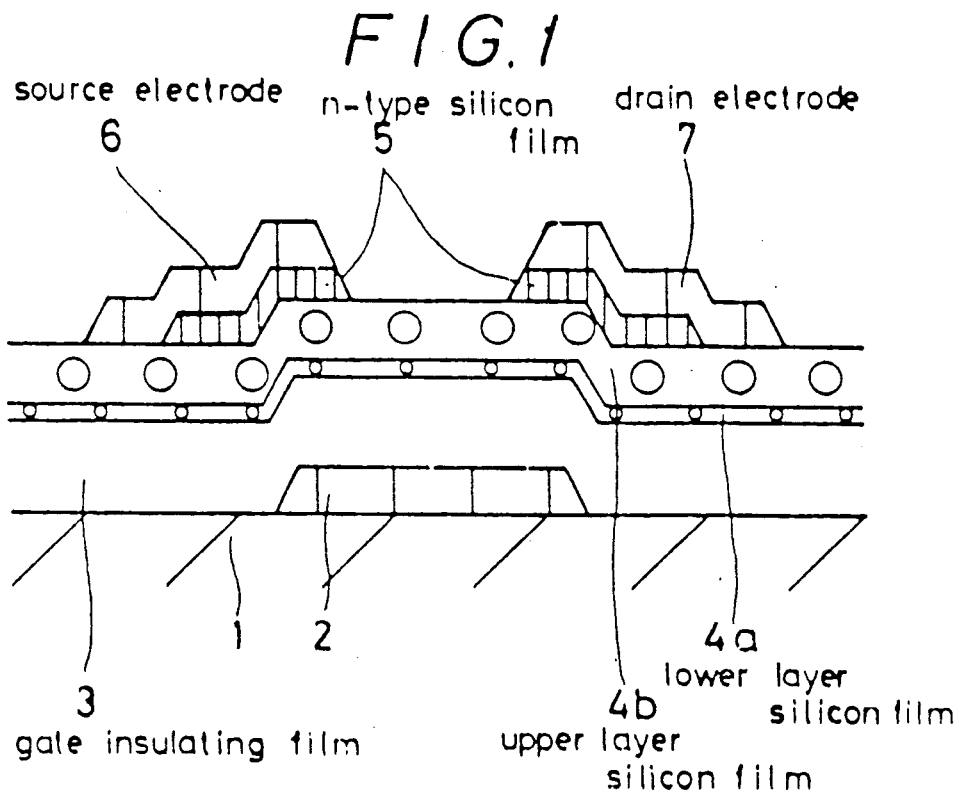
FIG. 1 is a cross-sectional view of a reverse staggered type silicon thin film transistor according to one embodiment of the present invention.

Referring to the drawings in detail, and initially to FIG. 1, a reverse staggered type silicon thin film transistor according to the present invention includes an insulating substrate 1, a gate electrode 2 thereon, a gate insulating film 3 thereon, a lower layer silicon film 4a contacting and formed on the above-described gate insulating film 3, an upper layer silicon film 4b contacting and formed below an n-type silicon film 5, and formed at a lower temperature than the film forming temperature of the above-described lower layer silicon film 4a, and a source electrode 6 and a drain electrode 7 formed thereon.

Figure 2:
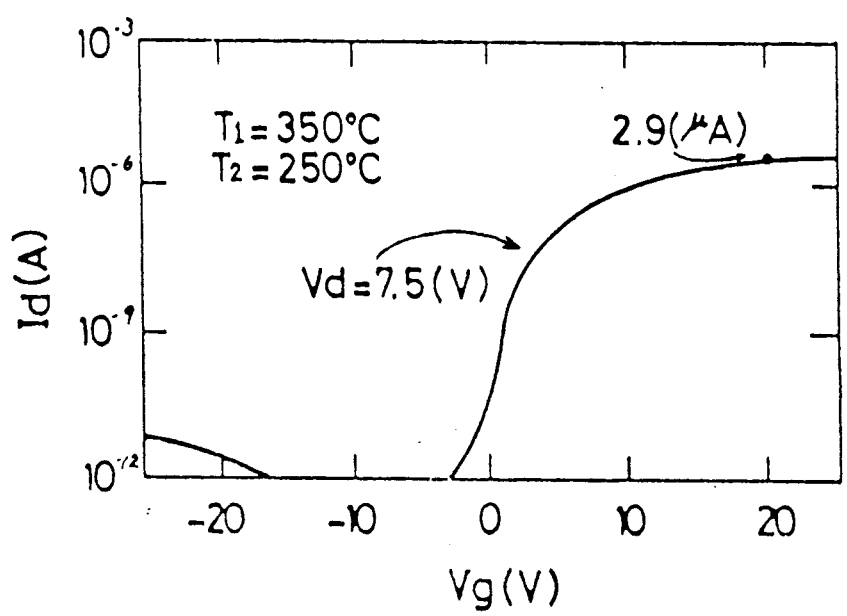
FIG. 2 is a graphical diagram showing the static characteristics of the above-described reverse staggered type silicon thin film transistor of FIG. 1.

FIG. 2 shows the static characteristics which vary as to the time of light illumination of the reverse staggered type silicon thin film transistor having the above-described structure. The lower layer silicon film 4a and upper layer silicon film 4b are made of amorphous silicon formed by the plasma CVD method, and the film forming temperatures $T_1$ and $T_2$ and the film thickness $t_1$ and $t_2$ are respectively as shown below.

In the lower layer silicon film 4a,
$T_1 = 350°$ C., and $t_1 = 30$ (nm),
and in the upper layer silicon film 4b,
$T_2 = 250°$ C., and $t_2 = 120$ (nm).

Figure 5:
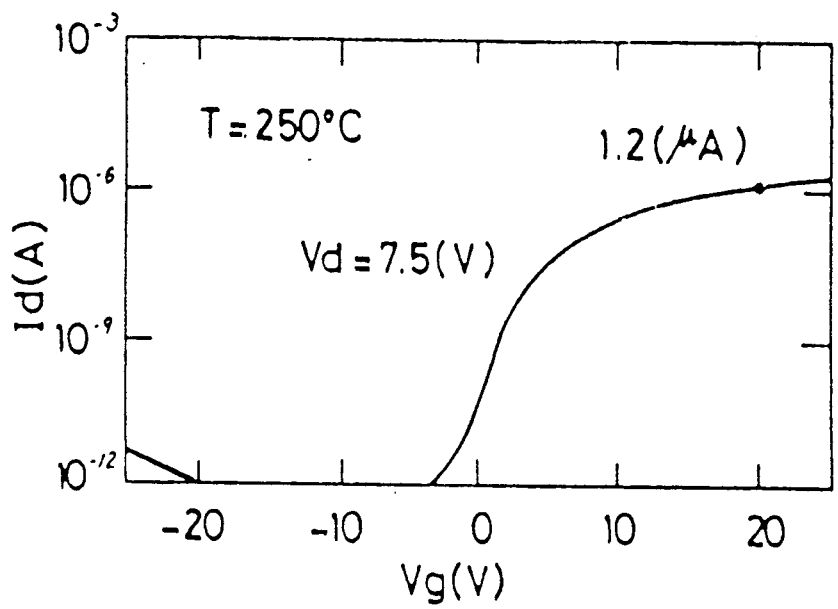
FIGS. 5 and 6 are graphical diagrams showing the static characteristics of the conventional reverse staggered type silicon transistor of FIG. 4.
Figure 6:
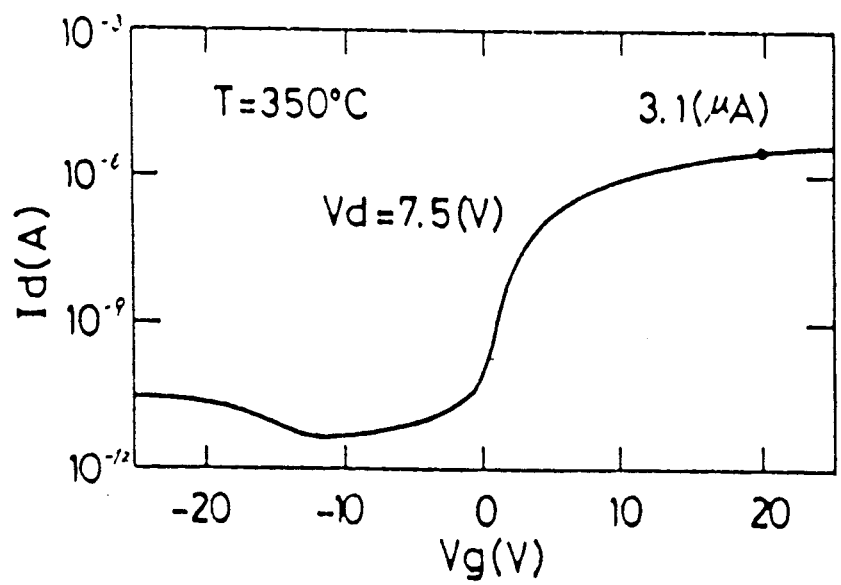

A reverse staggered type silicon thin film transistor formed under the above-described conditions, in contrast to the conventional reverse staggered type silicon thin film transistor shown in FIGS. 5 and 6, has its on-current approximately equal to that shown in FIG. 6 (T=350° C.), and its off-current to that shown in FIG. 5 (T=250° C.). That is, the on-current depends on the film forming temperature of lower layer silicon film 4a in contact with gate insulating film 3, and the off-current to the film forming temperature of upper layer silicon film 4b in contact with n-type silicon film 5.

Therefore, by making the film forming temperature of upper layer silicon film 4b to be lower than the film forming temperature of lower layer silicon film 4a, as in the case of the above-described reversed staggered silicon thin film transistor, the ratio of the on-current to the off-current can be made large.

Also, in general, the silicon film can be made into a film of uniform thickness when the film forming temperature is as low as possible. Specifically, by making the film thickness of lower layer silicon film 4a of the high film forming temperature thinner, as described above, and by making the film thickness of upper layer silicon film 4b of the low film forming temperature thicker, it becomes possible to make the film thickness of the silicon film uniform and to increase the uniformity of the element characteristics.

Figure 3:
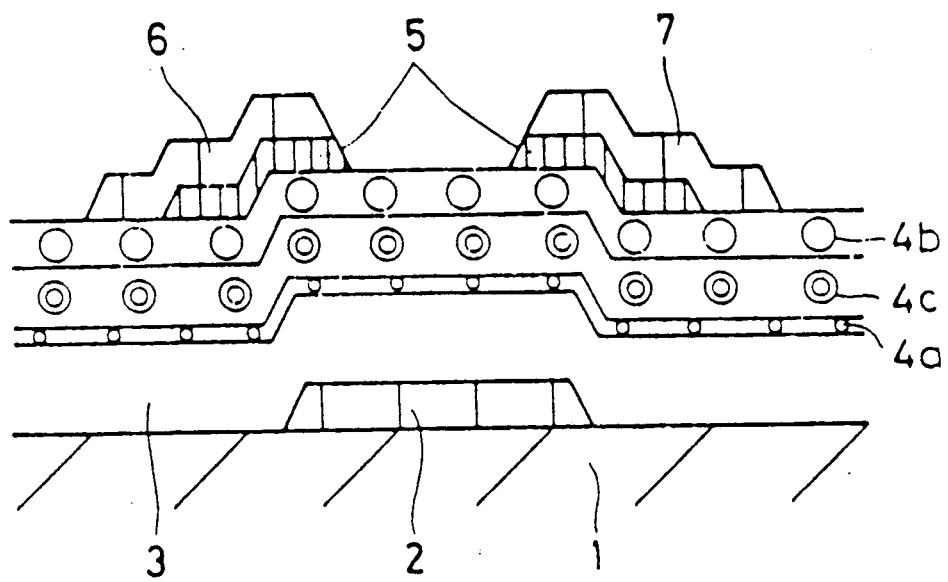
FIG. 3 is a cross-sectional view of a reverse staggered type silicon thin film transistor according to another embodiment of the present invention.
Figure 4:
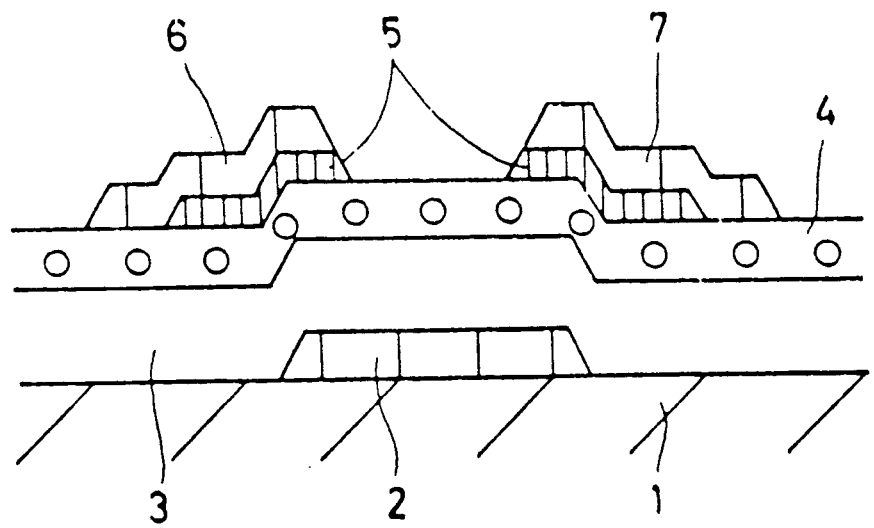
FIG. 4 is a cross-sectional view of a conventional reverse staggered type silicon thin film transistor.

FIG. 3 shows another embodiment of the present invention.

In this embodiment, as shown in FIG. 3, an intermediate silicon film 4c is provided between lower layer silicon film 4a and upper layer silicon film 4b. Although it is preferable that the above-described intermediate silicon film 4c is formed as the film forming temperature gradually lowers from the film forming temperature of lower layer silicon film 4a to the film forming temperature of upper layer silicon film 4b, there may be a region where the film is formed at a higher temperature than the film forming temperature of lower layer silicon film 4a, or at a lower temperature than the film forming temperature of upper layer silicon film 4b.

In the second embodiment, advantages similar to those described with respect to the first above-described embodiment can also be obtained.

Further, in the reverse staggered silicon thin film transistor shown in FIGS. 1 and 3, it is preferable with respect to the characteristics thereof that the film forming temperature of n-type silicon film 5 is lower than the film forming temperature of upper layer silicon film 4b, and further, that lower layer silicon film 4a, upper layer silicon film 4b, and so on are continuously formed without breaking the vacuum.

Also, lower layer silicon film 4a, upper layer silicon film 4b, and intermediate silicon film 4c may be formed by the use of polysilicon or the like rather than amorphous silicon, and as the film forming method thereof, an optical CVD method, or the like, rather than the plasma CVD method can be used.

According to the present invention, since it is possible to obtain a reverse staggered type silicon thin film transistor having a high on-current and low off-current, that is, having a large current ratio thereof, the element characteristics are improved with respect to application of the transistor.

Further, by making the film thickness of lower layer silicon film 4a of the high film forming temperature thin, and by making the film thickness of upper layer silicon film 4b of the low film forming temperature thick, the film thickness of the whole silicon film becomes uniform, and an increase in uniformity of the element characteristics can be achieved.

Having described specific preferred embodiments of the invention with reference to the accompanying drawings, it will be appreciated that the present invention is not limited to those specific preferred embodiments, and that changes and modifications can be made by one of ordinary skill in the art without departing from the spirit or scope of the invention as defined by the appended claims.

What is claimed is:

1. A method of forming a reverse staggered type silicon thin film transistor, comprising the steps of:

forming a gate electrode on a substrate;

forming a gate insulating layer on said substrate and said gate electrode, said gate insulating layer having a transistor-forming portion;

forming a lower layer silicon film at a first temperature on the transistor-forming portion of the gate insulating layer and in contact therewith;

forming an intermediate silicon film on said lower layer silicon film;

forming an upper layer silicon film on said intermediate silicon film at a second temperature which is lower than said first temperature;

forming an n-type silicon layer on said upper layer silicon film and in contact therewith; and forming a source electrode and a drain electrode on said n-type silicon layer;

said step of forming the intermediate silicon film including the step of forming the intermediate silicon film as the temperature gradually lowers from said first temperature to said second temperature.

* * * * *